United States Patent
Minato

(10) Patent No.: US 6,252,259 B1
(45) Date of Patent: Jun. 26, 2001

(54) SEMICONDUCTOR SWITCHING DEVICE HAVING DIFFERENT CARRIER LIFETIMES BETWEEN A FIRST PORTION SERVING AS A MAIN CURRENT PATH AND THE REMAINING PORTION OF THE DEVICE

(75) Inventor: Tadaharu Minato, Itami (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/589,136

(22) Filed: Jun. 8, 2000

Related U.S. Application Data

(62) Division of application No. 08/450,145, filed on May 26, 1995, now Pat. No. 6,100,575, which is a continuation of application No. 08/095,523, filed on Jul. 26, 1993, now abandoned, which is a continuation-in-part of application No. 07/912,173, filed on Jul. 13, 1992, now abandoned, which is a continuation-in-part of application No. 07/233,823, filed on Aug. 10, 1988, now Pat. No. 5,144,402.

(30) Foreign Application Priority Data

Aug. 19, 1987 (JP) .................................................. 62-206856

(51) Int. Cl.[7] .......................... H01L 29/74; H01L 31/111; H01L 29/30
(52) U.S. Cl. .......................... 257/138; 257/133; 257/147; 257/617
(58) Field of Search .................................. 257/335, 378, 257/617, 133, 138, 147

(56) References Cited

U.S. PATENT DOCUMENTS

| | | |
|---|---|---|
| 4,281,336 | 7/1981 | Sommer et al. . |
| 4,314,595 | 2/1982 | Yamamoto et al. . |
| 4,370,180 | 1/1983 | Azuma et al. . |
| 4,511,913 | 4/1985 | Nagano . |
| 4,620,211 | 10/1986 | Baliga et al. . |
| 4,710,792 | 12/1987 | Suzuki . |
| 5,144,402 | 9/1992 | Minato . |
| 5,162,876 | 11/1992 | Kitagawa et al. . |

OTHER PUBLICATIONS

Solid–State Electronics vol. 30, No. 2, pp 185–188, 1987 "Temperature Behavior and Annealing of Insulated Gate Transistors Subjected to Localized Lifetime Control by Proton Implantation".

The Report of Hosei University Ion Beam Engineering Laboratory, Separate vol. 6, 1987, pp 93–98, Japan, "Production of Static Induction Thyristors by Proton Irradiation".

Primary Examiner—Ngân V. Ngô
(74) Attorney, Agent, or Firm—Oblon, Spivak, McClelland, Maier & Neustadt, P.C.

(57) ABSTRACT

A semiconductor layer, through which a main current flows, is so structured that a carrier life time in the semiconductor layer is uniform in accordance with a predetermined distribution of the carrier life time. Thus, turn OFF characteristics of a semiconductor switching device can be improved without causing any unacceptable disadvantages for other characteristics.

5 Claims, 13 Drawing Sheets

SEMICONDUCTOR SWITCHING DEVICE HAVING DIFFERENT CARRIER LIFETIMES BETWEEN A FIRST PORTION SERVING AS A MAIN CURRENT PATH AND THE REMAINING PORTION OF THE DEVICE

This application is a division of application Ser. No. 08/450,145, filed May 26, 1995, now U.S. Pat. No. 6,100,575, which is a continuation of application Ser. No. 08/095,523, filed Jul. 26, 1993, now abandoned, which is a continuation-in-part of application Ser. No. 07/912,173, filed Jul. 13, 1992, now abandoned, which is a continuation-in-part of application Ser. No. 07/233,823, filed Aug. 10, 1988, now U.S. Pat. No. 5,144,402.

BACKGROUND OF THE INVENTION

1. Field of the Invention

The present invention relates to a semiconductor switching device such as a thyristor, transistor, diode and complex bipolar devices, and a method of controlling a carrier lifetime in a semiconductor switching device.

2. Description of the Background Art

It is known in the art to control a carrier lifetime in a semiconductor switching device by irradiating the semiconductor switching device with a radiation, such as an electron beam, a proton beam, neutron beam, alpha rays, charged particle beam, and gamma rays, to cause radiation defects, or lattice defects in a wide sense. An example, in which a buried gate type static induction thyristor (hereinafter referred to as an SI thyristor) is irradiated with a radiation, will be described.

FIG. 1 is a cross-sectional view schematically showing the main portion of a structure of a conventional SI thyristor which has radiation defects caused by irradiation with a radiation. FIG. 2 is a view showing a process of irradiating an SI thyristor with a radiation.

Referring to FIG. 1, the SI thyristor comprises an N type semiconductor substrate 1, an anode region 2 which is formed on the back surface of the semiconductor substrate 1 by diffusing P type impurities, a cathode region 3 which is formed on the top surface of a jut of the semiconductor substrate 1 by diffusing N type impurities, and gate regions 4 which are, formed on step portions of the semiconductor substrate 1 by diffusing P type impurities. A main current 9 flows through a channel region 5, which is surrounded by the gate regions 4.

This SI thyristor is irradiated with a radiation 10 such as an electron beam to cause radiation defects 7 in the semiconductor substrate 1, as shown in FIG. 2. The radiation defects 7 are uniformly distributed all over the irradiated portion of the semiconductor substrate 1, since the radiation defects 7 are caused by the interaction of the radiation 10 and atoms and/or vacancy forming the semiconductor substrate 1. In FIG. 1 and FIG. 2, however, the radiation defects 7 are shown by only some cross marks for the convenience of illustration.

The operation of the SI thyristor, in the condition that a carrier lifetime is uniformly decreased all over the semiconductor substrate 1 due to the radiation defects 7, will now be roughly described. In an ON state, the main current 9 flows from the anode region 2 to the cathode region 3 through the channel region 5 against the interruption of the radiation defects 7, while many carriers 8 are trapped by the radiation defects 7. At the moment of a turn OFF of the SI thyristor, a number of carriers remain in the semiconductor substrate 1. If the lifetime of the carriers is long, the substantial turn OFF time of the SI thyristor becomes long. However, the SI thyristor shown in FIG. 1 has a number of radiation defects 7 which serve as a lifetime killer to the carriers, and hence the turn OFF time of the SI thyristor is decreased because a tail current and, therefore, a tail time is decreased. Thus, the switching loss of the SI thyristor in a turn OFF transition is greatly decreased by irradiating the SI thyristor with the radiation 10 to control a carrier lifetime.

However, such uniform irradiation of the semiconductor substrate 1 with the radiation 10 causes a number of radiation defects 7 in the channel region 5 through which the main current 9 flows, so that the forward voltage of the SI thyristor in an ON state is disadvantageously increased, mainly due to the decrease of a carrier lifetime in the channel region 5. The increase of the forward voltage results in the increase of a power loss in an ON state. Especially in a high breakdown voltage device such as a device having a higher breakdown voltage than 600 V, such increase of the forward voltage causes unacceptable ON state power loss and exothermic device destruction, since such a device generally has a substrate having a high specific resistance.

Further, at the initial stage of a turn ON transition, carriers must progress against the radiation defects 7, in other words, the main current 9 must flow in the substrate 1 having higher specific resistance but shorter minority carrier lifetime caused by the radiation defects 7, and hence the turn ON time of the SI thyristor is increased. This results not only in increase of a power loss but also in decrease of an operation frequency. Although, in a bipolar type device, a substrate of higher specific resistance results in lower ON voltage because a conductivity modulation can be easily caused due to low impurity concentration and long carrier lifetime, ON voltage is increased if the specific resistance of a substrate is increased as the result of decrease of a carrier lifetime due to irradiation.

If the SI thyristor is uniformly irradiated with a lot of radiation 10 to perform a strong lifetime control, a leak current in an OFF state is increased due to the occurrence of defects in a passivation film (not shown) and/or the deterioration of a surface condition of the substrate 1, and a main breakdown voltage is decreased due to the increase of a leak current at the exposed edges of P-N junctions defined by the substrate 1 and the gate regions 4.

In an MOS type transistor and thyristor, such as MOSFET and an Insulated Gate Bipolar Transistor (hereinafter referred to as an IGBT), MOS Gate SI Thyristor (hereinafter referred to as an MOS-SITh), MOS Gate GTO Thyristor (hereinafter referred to as an MOS-GTO), MOS Controlled Thyristor (hereinafter referred to as an MCT), Emitter Switched Thyristor (hereinafter referred to as an EST), MOS Assisted Gate Thyristor (hereinafter referred to as an MAGT), and other kind of MOS Gate devices, a gate portion includes an insulator such as a silicon oxide film. Therefore, if the MOS type device is irradiated with a radiation strongly to control a carrier lifetime, various surface states, which are induced in the interface of the gate portion and the substrate, make a gate controlling main current flow through beneath a gate difficult, in addition to the problems as hereinbefore described.

Thus, the lifetime control of a semiconductor switching device by the irradiation of a radiation such as an electron beam has the advantage of decrease of a turn OFF time and the disadvantages of increase of a turn ON time as well as a forward voltage, and in some cases decrease of a breakdown voltage and especially in MOS devices to lose a controllability of MOS Gate. The advantage and disadvantages are in a trade-off relationship, so it is difficult to appropriately accommodate the trade-off relationship for particular use of the semiconductor switching device.

A method of partly recovering deteriorated characteristics of semiconductor switching device caused by irradiation is annealing process, which is conventionally and widely used to recover some kinds of crystal defects. Through the annealing process, the deteriorated characteristics are uniformly recovered, since a whole semiconductor switching device is only put into a uniformly high temperature condition during the anneal processing. Therefore, point of view to improve the trade-off relationship between a turn-off time and on-state voltage, this annealing process is equivalent to choose optimum quantity of irradiation of a radiation to implement a device having desired characteristics, and hence the problems as hereinbefore described cannot be solved in essence through the annealing process.

SUMMARY OF THE INVENTION

According to the first aspect of the present invention, a semiconductor switching device has a semiconductor layer through which a main current flows. This semiconductor layer is so structured that a carrier lifetime in the semiconductor layer is nonuniform in accordance with a predetermined distribution of the carrier lifetime.

According to the second aspect of the present invention, a method of controlling a carrier lifetime in a semiconductor switching device, having a semiconductor layer through which a main current flows, comprises the steps of preparing a semiconductor switching device and a radiation source for emitting a radiation, and irradiating the semiconductor switching device with the radiation emitted from the radiation source to cause radiation defects distributed in the semiconductor layer, in predetermined space and density distributions of the radiation defects.

Accordingly, it is an object of the present invention to provide a semiconductor switching device and a method of controlling a carrier lifetime in a semiconductor switching device, in which turn OFF characteristics of a semiconductor switching device can be improved without causing any unacceptable disadvantages for other characteristics.

These and other objects, features, aspects and advantages of the present invention will become more apparent from the following detailed description of the present invention when taken in conjunction with the accompanying drawings.

DETAILED DESCRIPTION OF THE INVENTION

Figure 1:
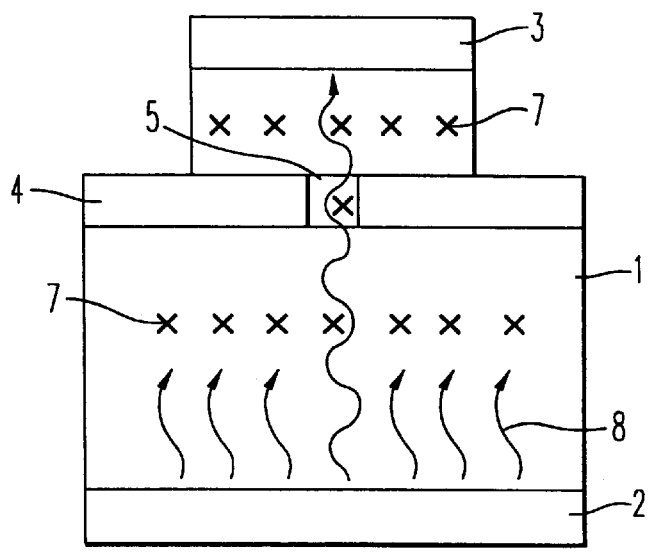
FIG. 1 is a cross-sectional view schematically showing the main portion of a structure of a conventional SI thyristor which has radiation defects caused by irradiation with a radiation.
Figure 2:
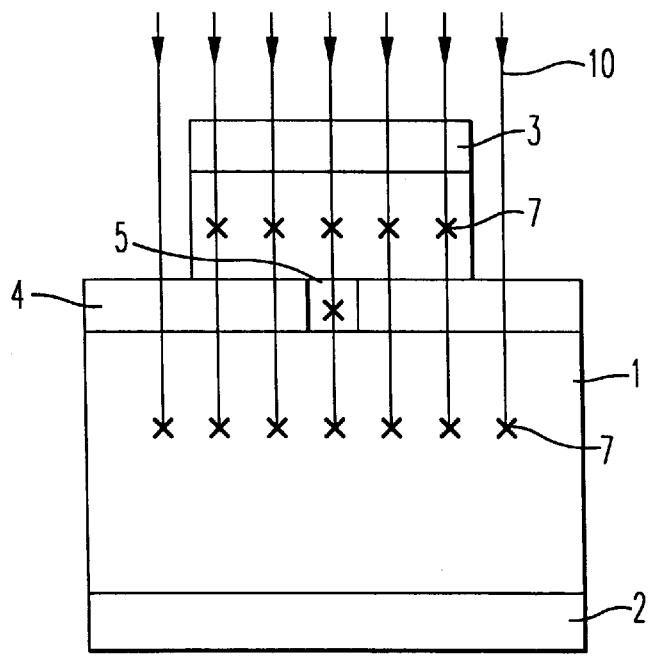
FIG. 2 is a view showing a process of irradiating an SI thyristor with a radiation.
Figure 3:
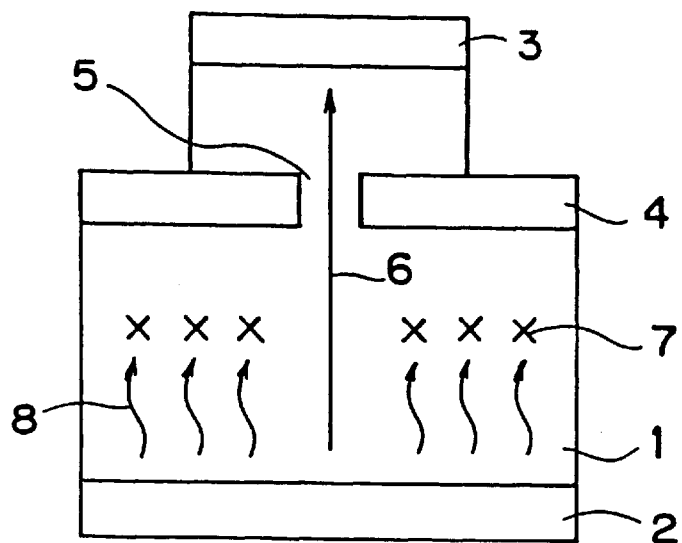
FIG. 3 is a cross-sectional view schematically showing the main portion of a structure of an SI thyristor according to an embodiment of the present invention.

FIG. 3 is a cross-sectional view schematically showing the main portion of a structure of an SI thyristor according to an embodiment of a semiconductor switching device in accordance with the present invention. Referring to FIG. 3, this SI thyristor has an N type semiconductor substrate 1. An anode region 2 is formed on the back surface of the semiconductor substrate 1 by diffusing P type impurities. A cathode region 3 is formed on the top surface of a jut of the semiconductor substrate 1 by diffusing N type impurities. Gate regions 4 are formed on step portions of the semiconductor substrate 1 by diffusing P type impurities. In this Mesa-type device structure, it is a very complicated process to form gate regions, but this process is not described here. A channel region 5, through which a main current 6 flows, is surrounded by the gate regions 4.

Figure 4:
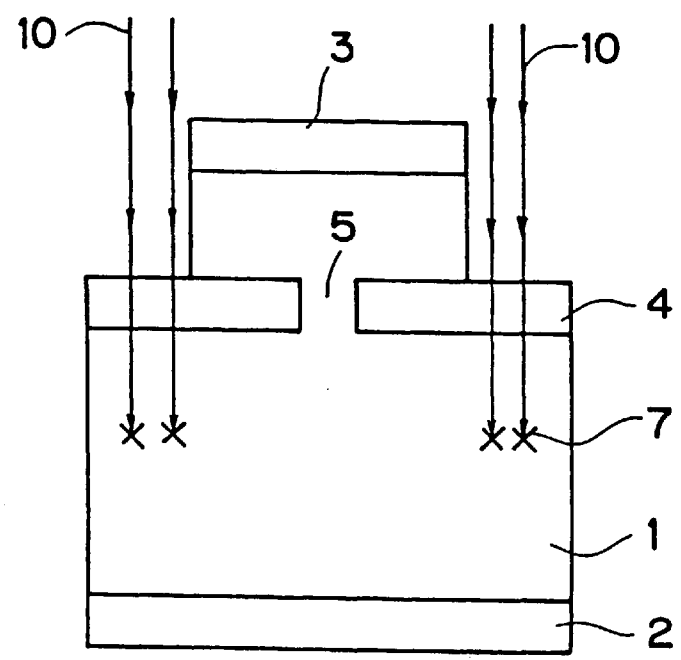
FIG. 4 is a view showing an example of the irradiation of an SI thyristor with a radiation in accordance with the present invention.

This SI thyristor is irradiated with a radiation 10 such as an electron beam, proton ($H^+$) beam, Neutron Beam, Helium Beam ($He^+$, $He^{++}$), Ion Beam (where the ion may be B, Al, Ga, P, As, Sb, Si, Ge, C, Ar, Ne, Kr, F, N, O, Fe, Ni, Co, Cr, a heavy metal, or the like or complex thereof) or combination thereof to cause radiation defects 7, such as lattice or point defects, dislocations, dislocation loop, slip, stress or strain, precipitate, vacancy, divacancy, vacancy complex or any other lifetime killers or combinations thereof in desired portions of the conductor substrate 1. Considering the function of a semiconductor device, lattice defects and other defects serve as a recombination center of carriers (especially holes). The radiation source may be an electrostatic accelerator (e.g., ion injector, electron microscope, VandeGraff accelerator) linear accelerator (lineac) or a cyclotron, for example. FIG. 4 is a view showing an example of the irradiation of the SI thyristor with the radiation 10 in accordance with the present invention. Referring to FIG. 4, the SI thyristor is selectively irradiated with the radiation 10. As a result, the radiation defects 7 are densely and uniformly caused only in the irradiated portions, i.e., peripheral portions of the semiconductor substrate 1. In FIG. 3 and FIG. 4, the radiation defects 7 are shown by only some cross marks for the convenience of illustration.

In an ON state, the main current 6 flows from the anode region 2 to the cathode region 3 through the channel region 5 without being interrupted by the radiation defects 7 in the middle or central portion of the substrate 1, while some carriers 8 are trapped by the lattice defects 7. Thus, the forward voltage of the SI thyristor is not so increased in spite of the presence of the lattice defects 7.

At the moment of a turn OFF of the SI thyristor, a number of carriers remain in the semiconductor substrate 1. The radiation defects 7 serve as a lifetime killer or as a recombination center, so that the lifetime of the carriers decreased. Thus, the turn OFF time of the SI thyristor is sufficiently decreased as a result of the decrease of a tail current causing the decrease of a turn-off tail time, as is similar to the conventional SI thyristor hereinbefore described.

At the initial stage of a turn ON transition, carriers can progress without being interrupted by the radiation defects 7 in the middle of central portion of the substrate 1. Thus, the turn ON time of the SI thyristor is not so increased in spite of the presence of the radiation defects 7.

Even if the SI thyristor is irradiated with a lot of radiation 10 to perform a strong lifetime control, damages due to much radiation are only partially caused because of the selective and/or local irradiation. That is, the occurrence of defects in a passivation film (not shown) and the deterioration of a surface condition of the substrate 1 are limited to be partial, and hence a leak current in an OFF state is not so increased. Further, in an MOS type device, if the irradiation of the MOS type transistor with a radiation is performed exclusive of a gate portion having an insulation film, it cannot be caused that various surface states are induced in the interface of the gate portion and a substrate to make a gate-control difficult.

Thus, according to this embodiment, turn OFF characteristics of a semiconductor switching device (can be improved without causing any disadvantages, such as unacceptable increase of a turn ON time and a forward voltage and/or decrease of a breakdown voltage and/or a gate controllability.

Figure 5:
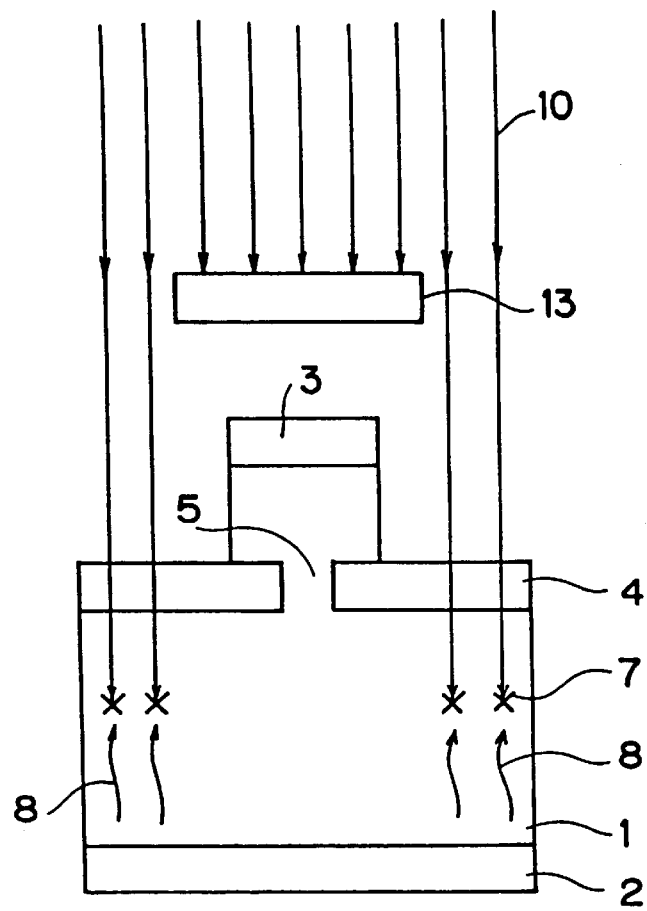
FIG. 5 and FIG. 6 are views showing examples of a structure for irradiating an SI thyristor with a radiation.
Figure 6:
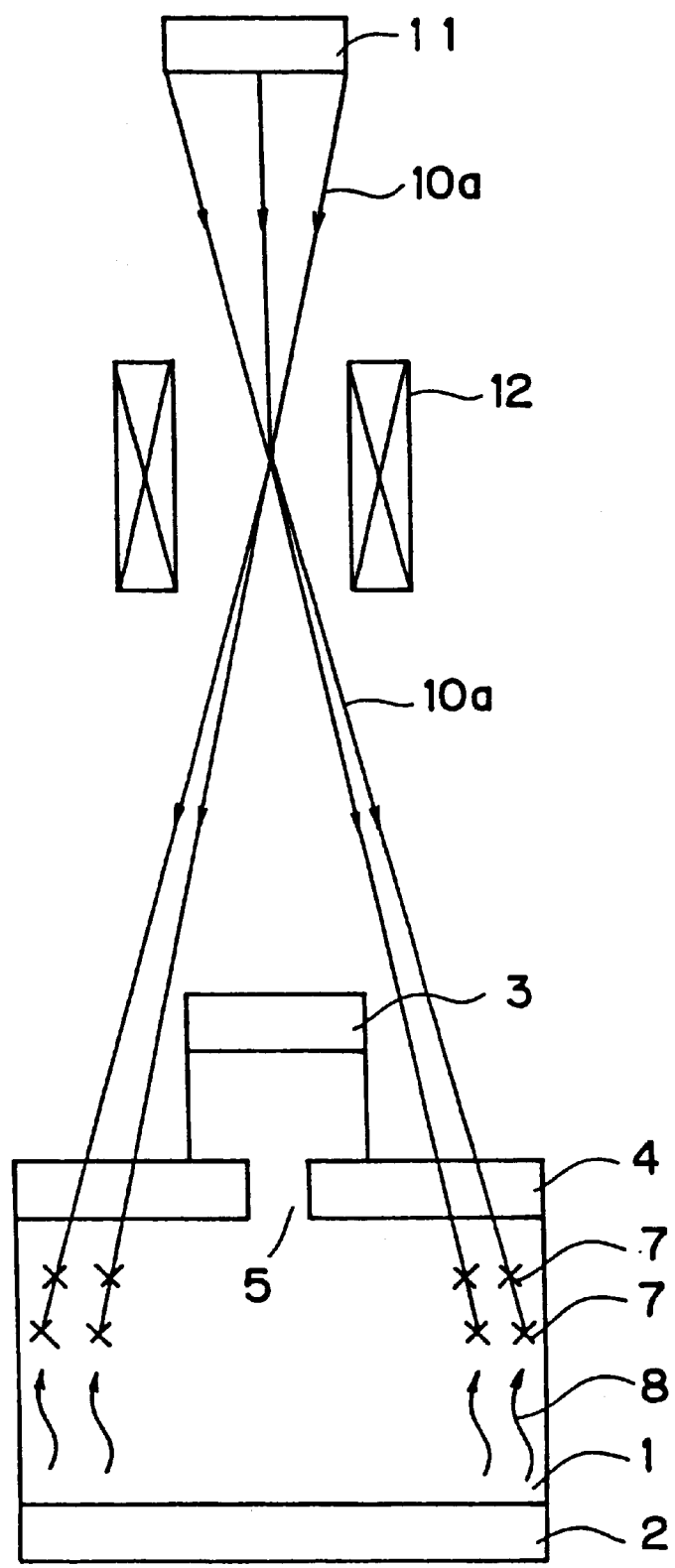

FIG. 5 and FIG. 6 are views showing examples of a structure for irradiating an SI thyristor with a radiation. Referring to FIG. 5, a shading plate 13 is placed above an SI thyristor so that a radiation 10 proceeding to the central portion of the SI thyristor is blocked. The following modes may be incorporated for the irradiating radiation:

1) both the shading plate and SI thyristor are fixed;
2) the SI thyristor is fixed and the shading plate is moved in the prescribed extent; or
3) the shading plate is fixed and the SI thyristor is moved in the prescribed extent.

When radiation is irradiated, the radiation intensity may be changed with time.

Because of the three modes of irradiation listed above and/or the radiation intensity possibly changing with time, it is possible to make the lifetime killer, which is incorporated in the SI thyristor, to have a desired space and density distribution. Thus, the SI thyristor can be irradiated with the radiation 10 only in the peripheral portion thereof.

Referring to FIG. 6, a radiation source 11 and an electromagnetic lens 12 are placed above an SI thyristor. The radiation source 11 emits a charged particle beam 10a which is scanned by the electromagnetic lens 12 to irradiate the desired portion of the SI thyristor. When the beam is irradiated the total radiation time for each of the fine portions may be distributed in a prescribed manner. When the beam is irradiated the beam intensity may also be changed with time. Because of the total radiation time for each of the fine portions be distributed or the beam intensity being changed, it is possible to make the lifetime killer, which is incorporated in the SI thyristor to have a desired space and density distribution. Thus, the SI thyristor can be irradiated with the charged particle beam 10a, which is a kind of radiation, only in the peripheral portion thereof. It should also be noted in FIG. 5 that a mask such as a metal mask may be formed directly on the SI thyristor in place of the shading plate. The mask has a predetermined thickness distribution and a transmittance rate of irradiation may be changed with portions. In this case, the mask may be formed over the entire surface of the SI thyristor. A patterned through-hole may be formed directly on the surface of the SI thyristor by using a conventional lithography and etching method.

Because of the potential of the shading plate being replaced with a metal mask and transmittance rate of radiation being changed with the portions, it is possible to make the lifetime killer, which is incorporated in the SI thyristor to have a desired space and density distribution.

Figure 7:
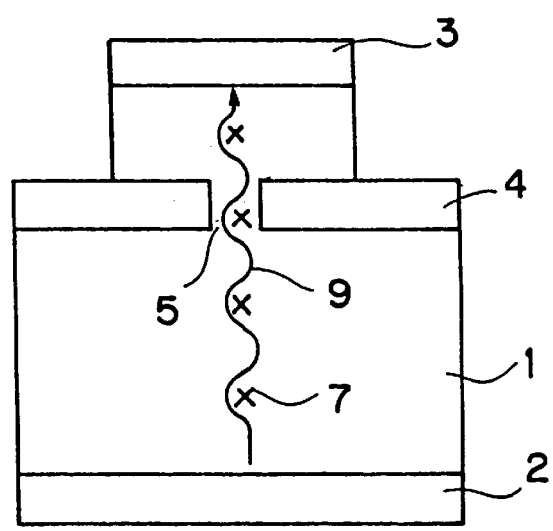
FIG. 7 is a cross-sectional view showing an SI thyristor according to another embodiment of the present invention.

FIG. 7 is a cross-sectional view showing an SI thyristor according to another embodiment of the semiconductor switching device in accordance with the present invention. Referring to FIG. 7, radiation defects 7 are caused only in the middle or central portion of a semiconductor substrate 1. This SI thyristor is so structured that the increase of a turn ON time and a forward voltage, due to the radiation defects 7 distributed mainly in a main current path, is compensated by the portion of an anode region 2 not corresponding to the main current path. Namely, the impurity concentration of the anode region 2 is relatively high in the peripheral portion thereof to increase a carrier injection efficiency from the anode region 2 to the semiconductor substrate 1, to thereby decrease the turn ON time and the forward voltage. According to this embodiment, radiation defects 7 in a channel region 5 operate to shorten the lifetime of carriers in the channel region 5, to hasten the pinch-off of the channel region 5 in a turn OFF transition. In addition, radiation defects 7 in the semiconductor substrate 1 decrease a tail current in the turn OFF transition. Thus, the turn OFF time of this SI thyristor is much decreased. If the semiconductor substrate 1 is thick so that a distance between the peripheral portion of the anode region 2 and the channel region 5 is longer than the mean free path of carriers, carriers injected from the peripheral portion of the anode region 2 disappear before they reach the channel region 5 in the turn OFF transition, so that the turn OFF time is further decreased.

In general, the structure shown in FIG. 7 is effective to much decrease a turn OFF time, in the case that the increase of a turn ON time and a forward voltage due to the radiation defects 7 in the middle or central portion of the substrate 1 is allowable. That is, if the SI thyristor shown in FIG. 7 has a wide anode region 2 of high impurity concentration, a carrier injection efficiency is increased. Further, if a breakdown voltage required for the SI thyristor is not so high, the specific resistance of the semiconductor substrate 1 may be low. In such a case, the SI thyristor is able to have a small turn ON time and forward voltage, so that a little increase of the turn ON time and forward voltage due to the radiation defects 7 is allowable.

Although the radiation defects 7 are densely and uniformly caused in the peripheral or middle or central portion of the substrate 1 in the above embodiments, the lattice defects 7 may be caused in desired space and density distributions in the substrate 1 to implement an SI thyristor of desired characteristics. This can be achieved by making the thickness of the shading plate 13 shown in FIG. 5 uneven to vary a transmission factor of the radiation 10 in accordance with the desired space and density distributions of the radiation defects 7, or by making the scanning speed of the charged particle beam 10a shown in FIG. 6 uneven in order to vary the irradiation time of the charged particle beam 10a in accordance with the desired space and density distributions of the radiation defects 7. Further, a plurality of kinds of radiation defects may be caused in the semiconductor substrate 1 in respective desired space and density distributions to implement an SI thyristor of desired characteristics.

Figure 8A:
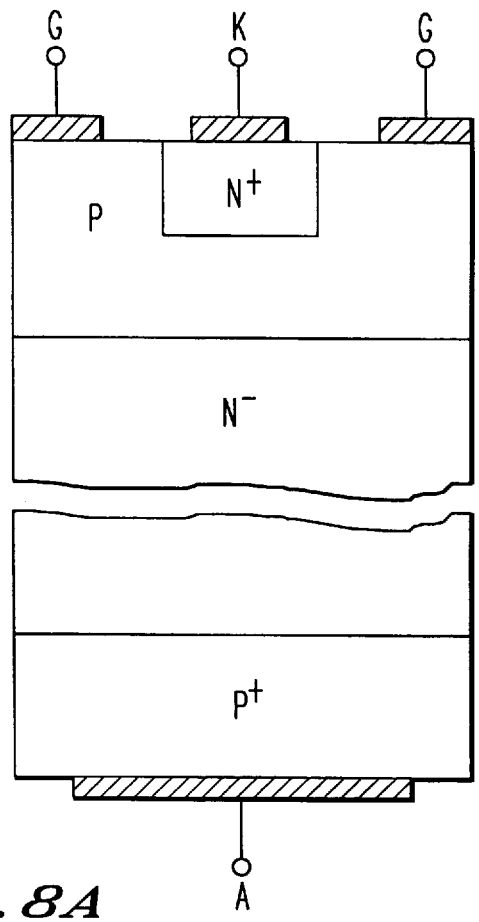
FIG. 8A is a cross-sectional view schematically showing a vertical type general thyristor.
Figure 8B:
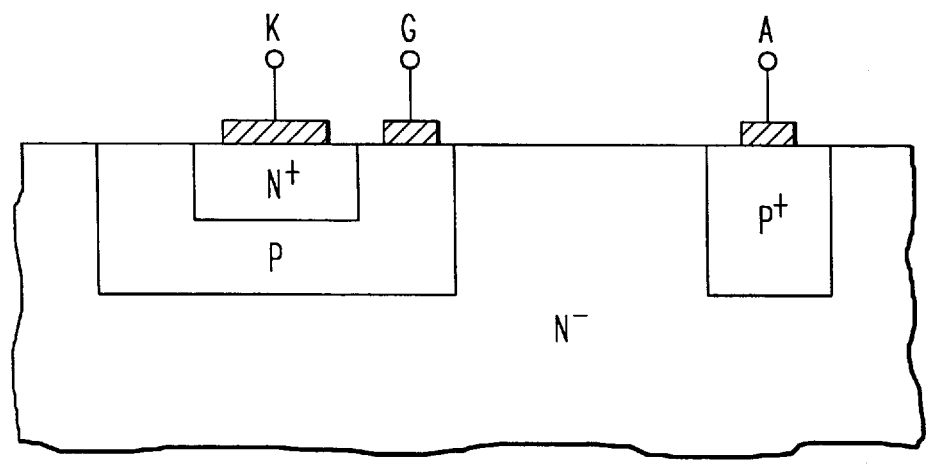
FIG. 8B is a cross-sectional view schematically showing a lateral type general thyristor.
Figure 9A:
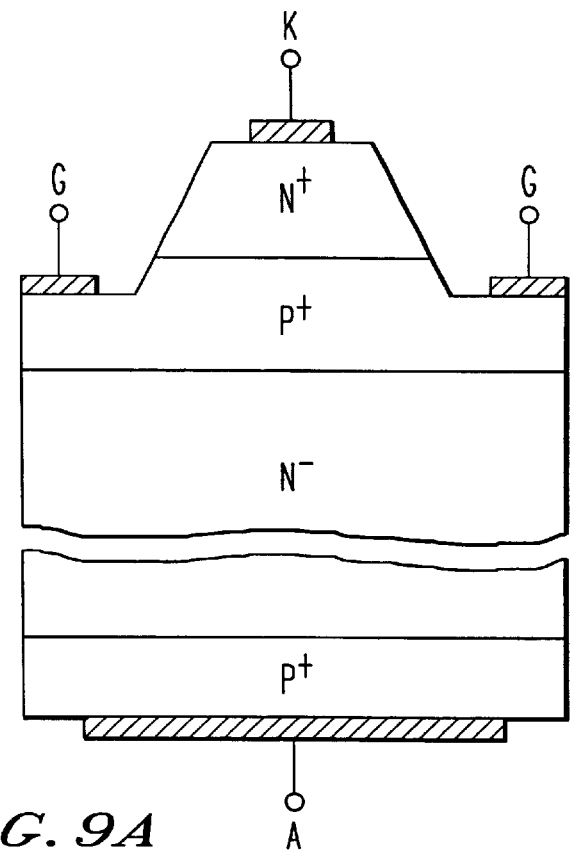
FIG. 9A is a cross-sectional view schematically showing a vertical type GTO thyristor.
Figure 9B:
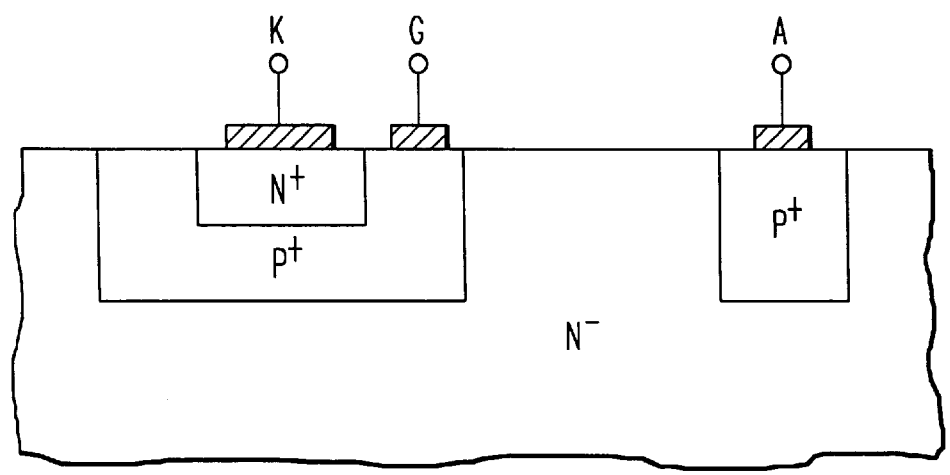
FIG. 9B is a cross-sectional view schematically showing a lateral type GTO thyristor.
Figure 10A:
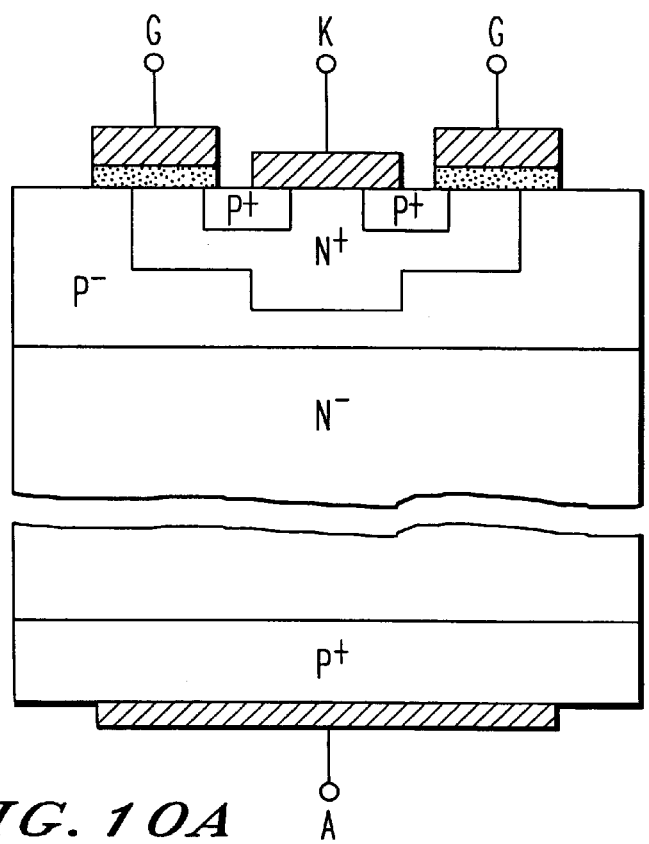
FIG. 10A is a cross-sectional view schematically showing a vertical P channel type MOS GTO thyristor.
Figure 10B:
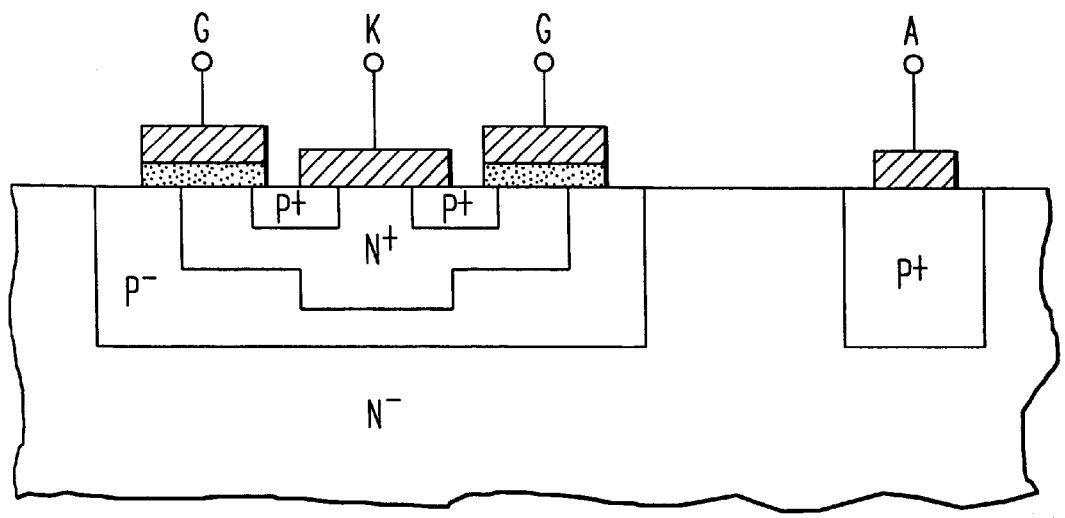
FIG. 10B is a cross-sectional view schematically showing a lateral P channel type MOS GTO thyristor.
Figure 11A:
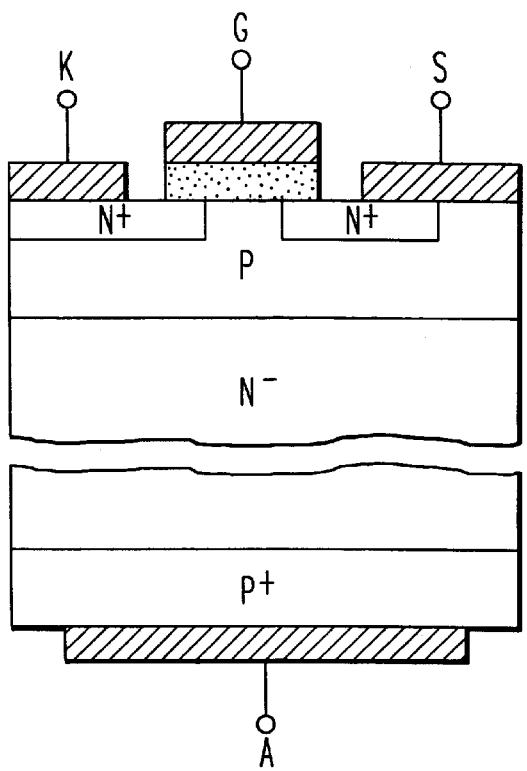
FIG. 11A is a cross-sectional view schematically showing a vertical N channel type MOS GTO thyristor.
Figure 11B:
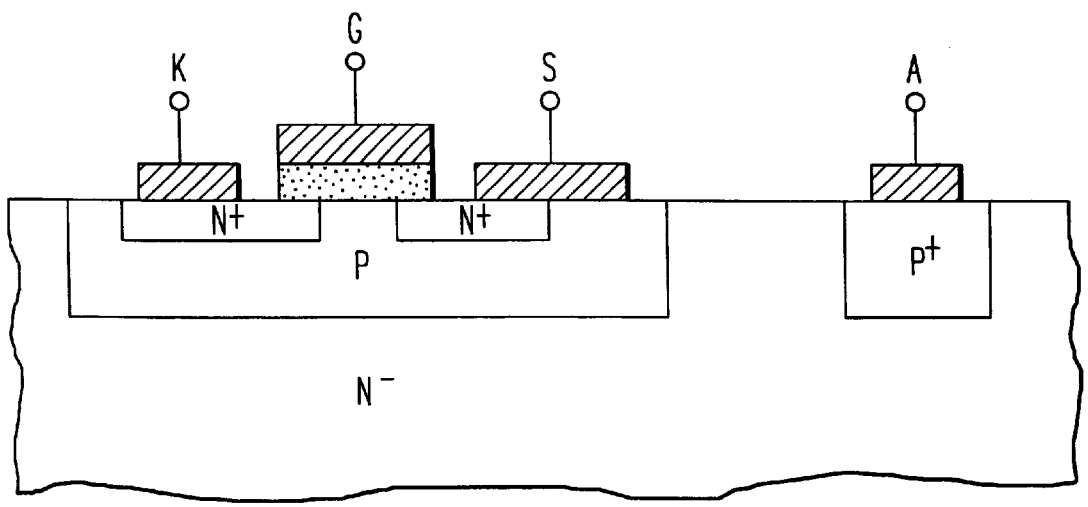
FIG. 11B is a cross-sectional view schematically showing a lateral N channel type MOS GTO thyristor.
Figure 12A:
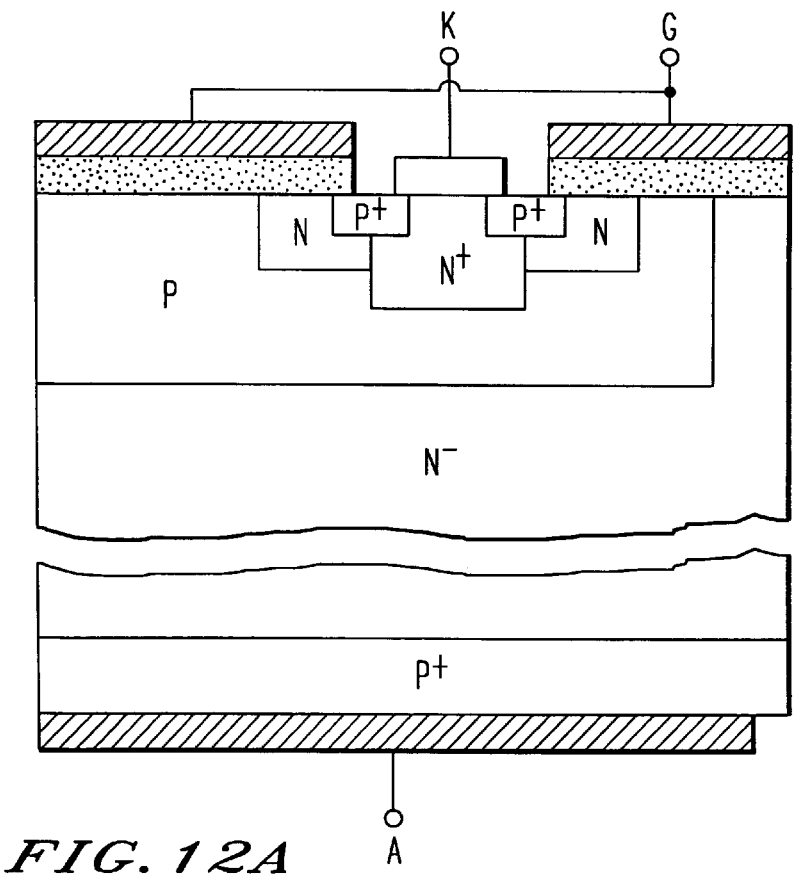
FIG. 12A is a cross-sectional view schematically showing a vertical type MOS controlled thyristor.
Figure 12B:
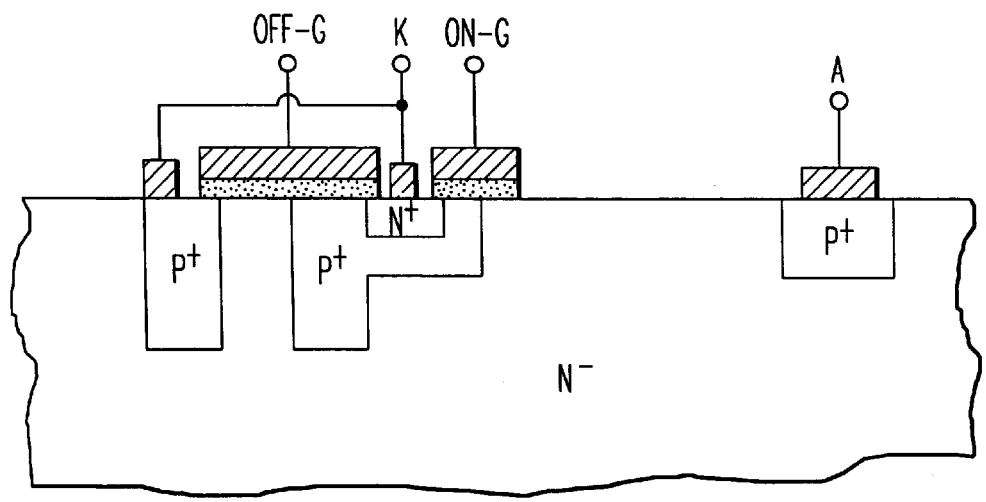
FIG. 12B is a cross-sectional view schematically showing a lateral type MOS controlled thyristor.
Figure 13A:
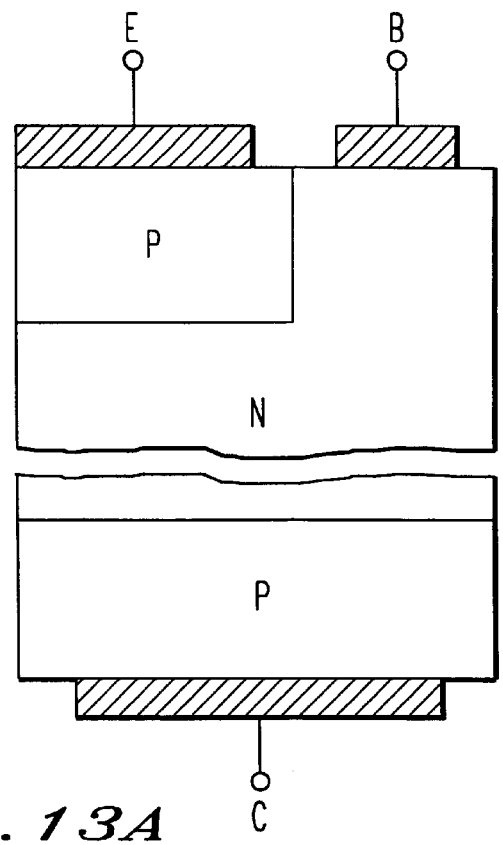
FIG. 13A is a cross-sectional view schematically showing a vertical PNP type general transistor.
Figure 13B:
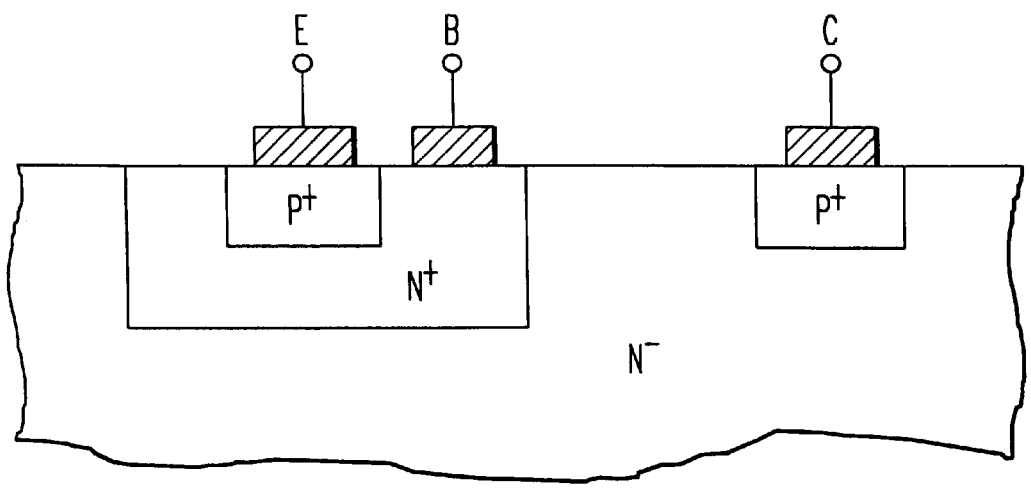
FIG. 13B is a cross-sectional view schematically showing a lateral PNP type general transistor.
Figure 14A:
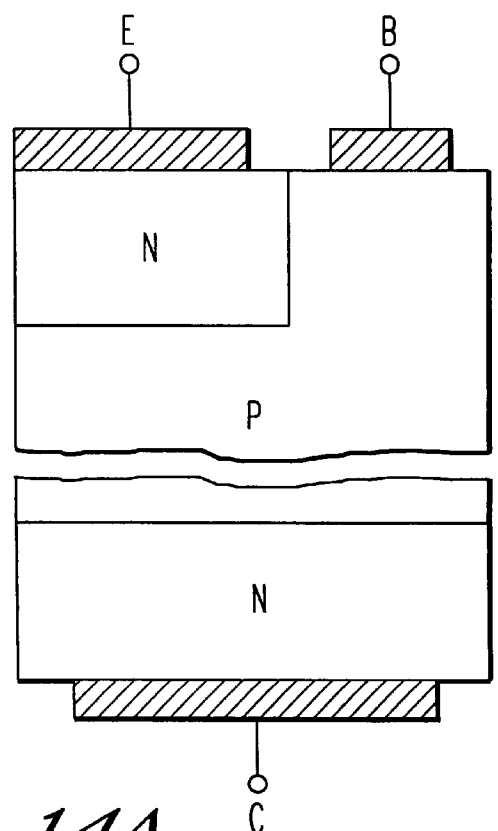
FIG. 14A is a cross-sectional view schematically showing a vertical NPN type general transistor.
Figure 14B:
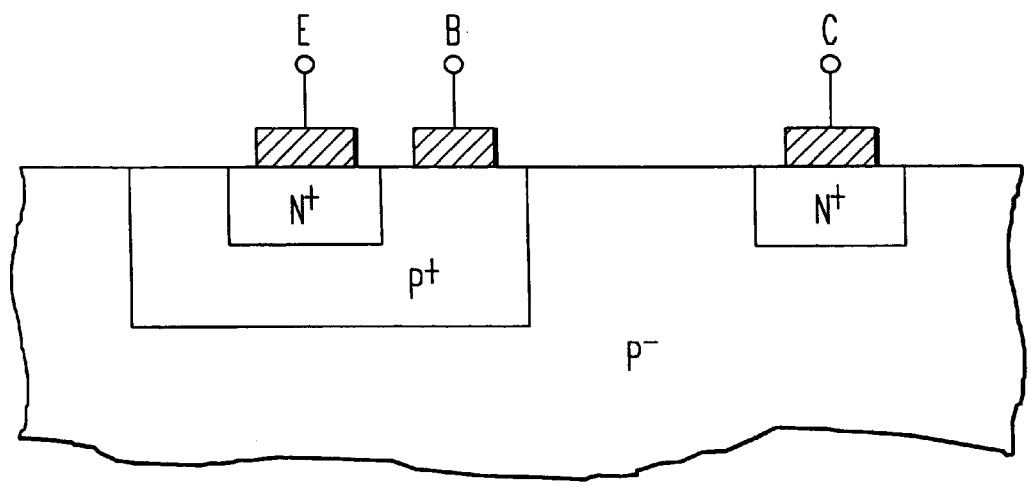
FIG. 14B is a cross-sectional view schematically showing a lateral NPN type general transistor.
Figure 15A:
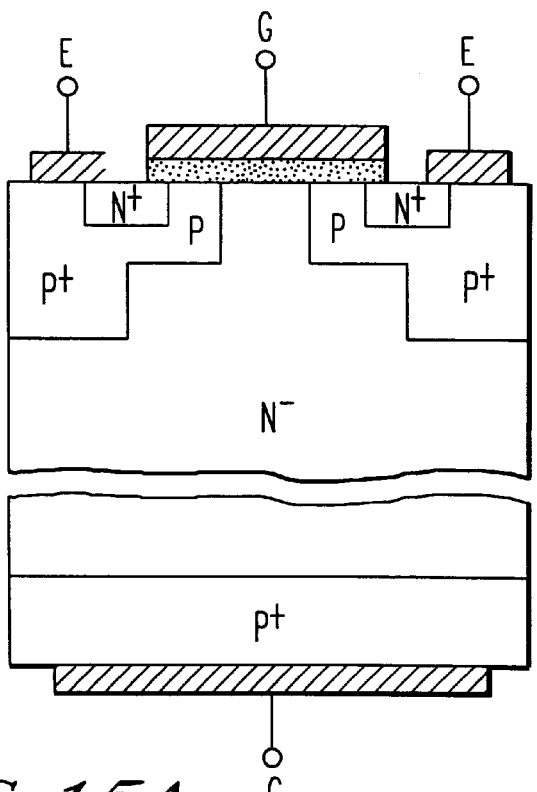
FIG. 15A is a cross-sectional view schematically showing a vertical type insulated gate bipolar transistor.
Figure 15B:
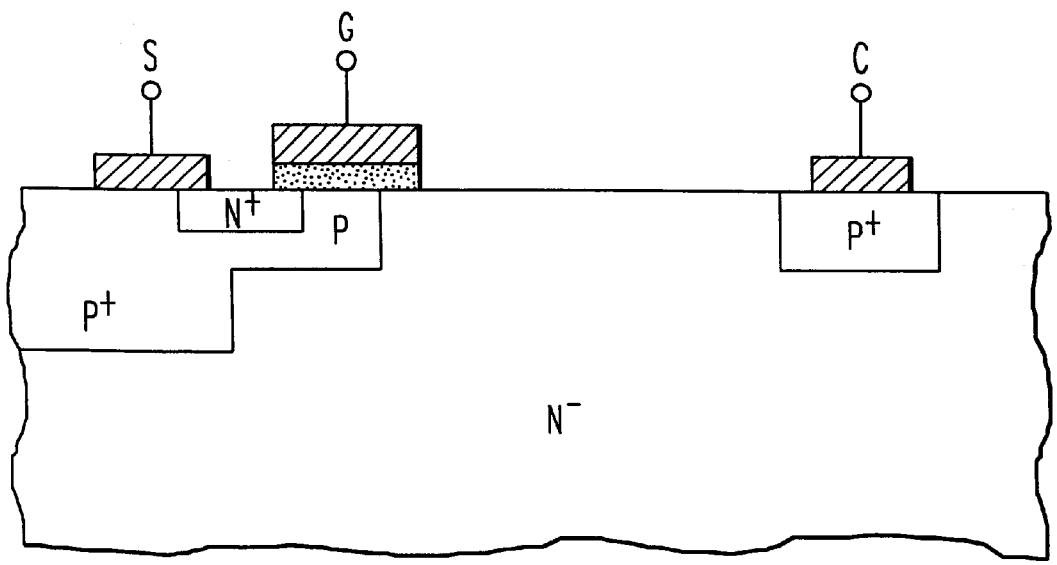
FIG. 15B is a cross-sectional view schematically showing a lateral type insulated gate bipolar transistor.
Figure 15C:
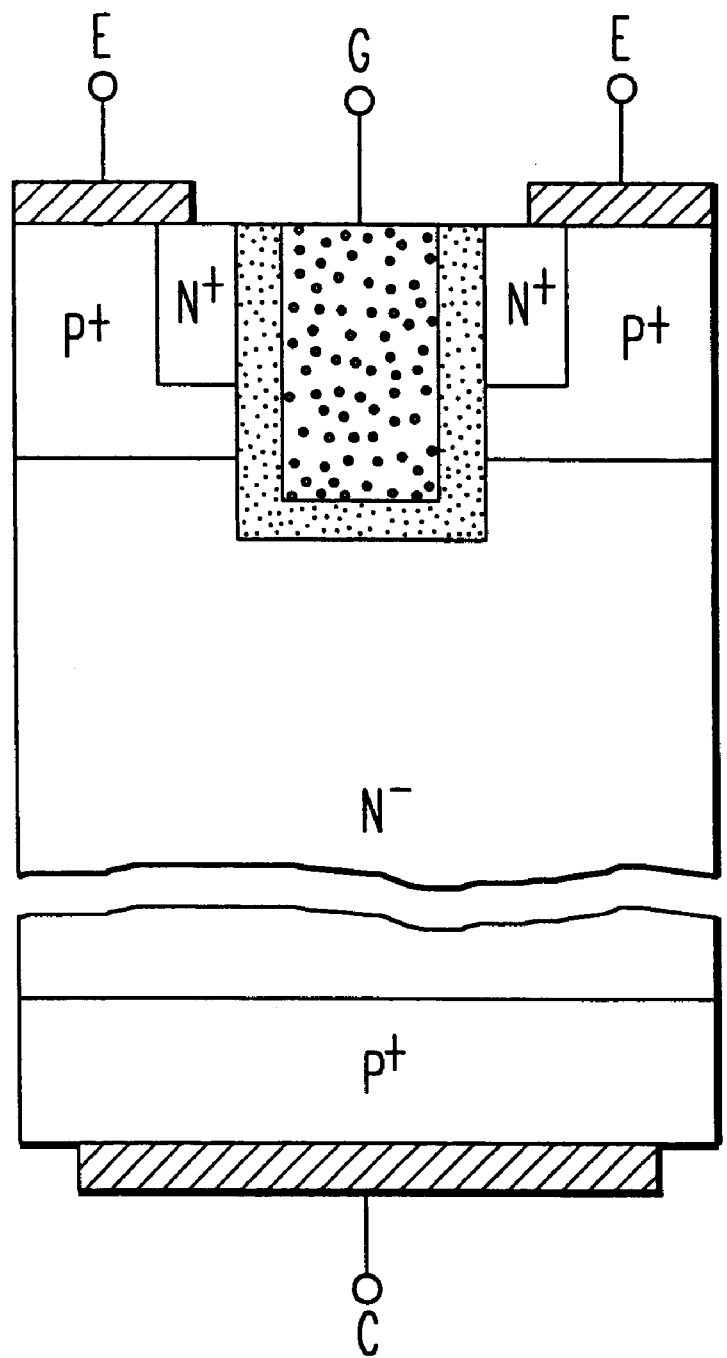
FIG. 15C is a cross-sectional view schematically showing a trench gate type insulated gate bipolar transistor.

Although the embodiments according to the present invention have been described in detail with respect to an SI thyristor which is a sort of bipolar type device, the present invention is applicable not only to some kinds of bipolar type devices but also to all semiconductor devices including both vertical and lateral (horizontal) type semiconductor switching devices such as diodes, general (or conventional) bipolar transistors as shown in FIG. 13A (vertical PNP type), FIG. 13B (lateral PNP type), FIG. 14A (vertical NPN type) and FIG. 14B (lateral NPN type), general (or conventional) thyristors as shown in FIG. 8A (vertical type) and FIG. 8B (lateral type), GTO thyristors (single gate type, double gate type, buried gate type, etc.) as shown in FIG. 9A (vertical type) and FIG. 9B (lateral type), SI thyristors (single gate type, double gate type, surface gate type, buried gate type, etc.), triacs, multi-layered bipolar type devices, and other bipolar type devices having MOS Gate structure or having complex device structure like PIC (Power IC), Smart Power IC, IPM (International Power Module), HIC (Hybrid IC). Bipolar type devices having MOS Gate Structure include IGBT (Insulated Gate Bipolar Transistor) as shown in FIG. 15A (vertical type) and FIG. 15B (lateral type), MOS Gate SI Thyristor, MOS-GTO Thyristor as shown in FIG. 10A (vertical P channel type), FIG. 10B (lateral P channel type), FIG. 11A (vertical N channel type) and FIG. 11B (lateral N channel type), MCT (MOS Controlled Thyristor) as shown in FIG. 12A (vertical type) and FIG. 12B (lateral type), EST (Emitter Switched thyristor), MAGT (MOS Assisted Gate Thyristor), and trench gate type devices thereof as shown in FIG. 15C (trench gate type IGBT). For purposes of this disclosure a generic term "composite" is used to define this plurality of elements. Specifically, a composite is a composite element (for example, the composition of a MOS and a bipolar device); something similar to an EST which is a single element composed of an IGBT and a thyristor, for example; something similar to a high voltage IC (i.e., a power IC in which a power element and a LSI such as a CMOS are employed).

The present invention is also applicable to a device of any substrate material such as Si. GaAs, Gap, InP, InGaAsP, Ge, C (Diamond), SiC, SiGe, CdS, CdTe, HgCdTe, etc.

Although the present invention has been described and illustrated in detail, it is clearly understood that the same is by way of illustration and example only and is not to be taken by way of limitation, the spirit and scope of the present invention being limited only by the terms of the appended claims.

What is claimed as new and desired to be secured by Letters Patent of the United States is:

1. A thyristor having a semiconductor layer with a current path portion extending substantially from a first electrode to a second electrode of said thyristor through which a main current flows such that said semiconductor layer is structured so that the carrier lifetime in said semiconductor layer is different between substantially all of said current path portion of said semiconductor layer serving as a path for most of said main current and a remaining portion of said semiconductor layer.

2. A gate turn off thyristor having a thyristor layer with a current path portion extending substantially from a first electrode to a second electrode of said gate turn off thyristor through which a main current flows such that said semiconductor layer is structured so that the carrier lifetime in said semiconductor layer is different between substantially all of said current path portion of said semiconductor layer serving as a path for most of said main current and a remaining portion of said semiconductor layer.

3. A MOS gate turn off thyristor having a semiconductor layer through which a main current flows such that said semiconductor layer is structured so that the carrier lifetime in said semiconductor layer is different between a first portion of said semiconductor layer serving as a path for most of said main current and a remaining portion of said semiconductor layer.

4. A MOS control thyristor having a semiconductor layer through which a main current flows such that said semiconductor layer is structured so that the carrier lifetime in said semiconductor layer is different between a first portion of said semiconductor layer serving as a path for most of said main current and a remaining portion of said semiconductor layer.

5. A power transistor having a semiconductor layer through which a main current flows such that said semiconductor layer is structured so that the carrier lifetime in said semiconductor layer is different between a first portion of said semiconductor layer serving as a path for most of said main current and a remaining portion of said semiconductor layer.

* * * * *